(12) United States Patent
Kitamura

(10) Patent No.: US 6,436,757 B1
(45) Date of Patent: Aug. 20, 2002

(54) METHOD FOR FABRICATING A CAPACITOR HAVING A TANTALUM OXIDE DIELECTRICS IN A SEMICONDUCTOR DEVICE

(75) Inventor: Hiroyuki Kitamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/715,142

(22) Filed: Nov. 20, 2000

(30) Foreign Application Priority Data

Nov. 18, 1999 (JP) .......................................... 11-328861

(51) Int. Cl.[7] .......................................... H01L 21/8242
(52) U.S. Cl. .......................................... 438/240; 438/396
(58) Field of Search .......................................... 438/3, 240–241, 438/238–239, 393–399, 250–256

(56) References Cited

U.S. PATENT DOCUMENTS 6,162,738 A * 12/2000 Chen et al. .................. 438/745
6,214,660 B1 * 5/2001 Uemoto et al. ............. 438/240

* cited by examiner

Primary Examiner—Jey Tsai
(74) Attorney, Agent, or Firm—McGinn & Gibb, PLLC

(57) ABSTRACT

In a method for fabricating a capacitor having a capacitor dielectric film formed of $Ta_2O_5$ in a semiconductor device, after a capacitor lower electrode is formed on an insulating film formed on a semiconductor substrate and a $Ta_2O_5$ film is formed on the capacitor lower electrode, the semiconductor substrate is immersed into a $H_2O_2$ containing solution, and then, the semiconductor substrate is heat-treated. Thereafter, a capacitor upper electrode is formed on the $Ta_2O_5$ film. Thus, the film quality of the $Ta_2O_5$ film is improved over the whole surface of the capacitor dielectric film, so that a capacitor having an excellent heat resistance property and a good leak current characteristics is realized, and at the same time, a good reliability of the transistor is maintained, since the transistor is subjected to no ultraviolet radiation.

8 Claims, 3 Drawing Sheets

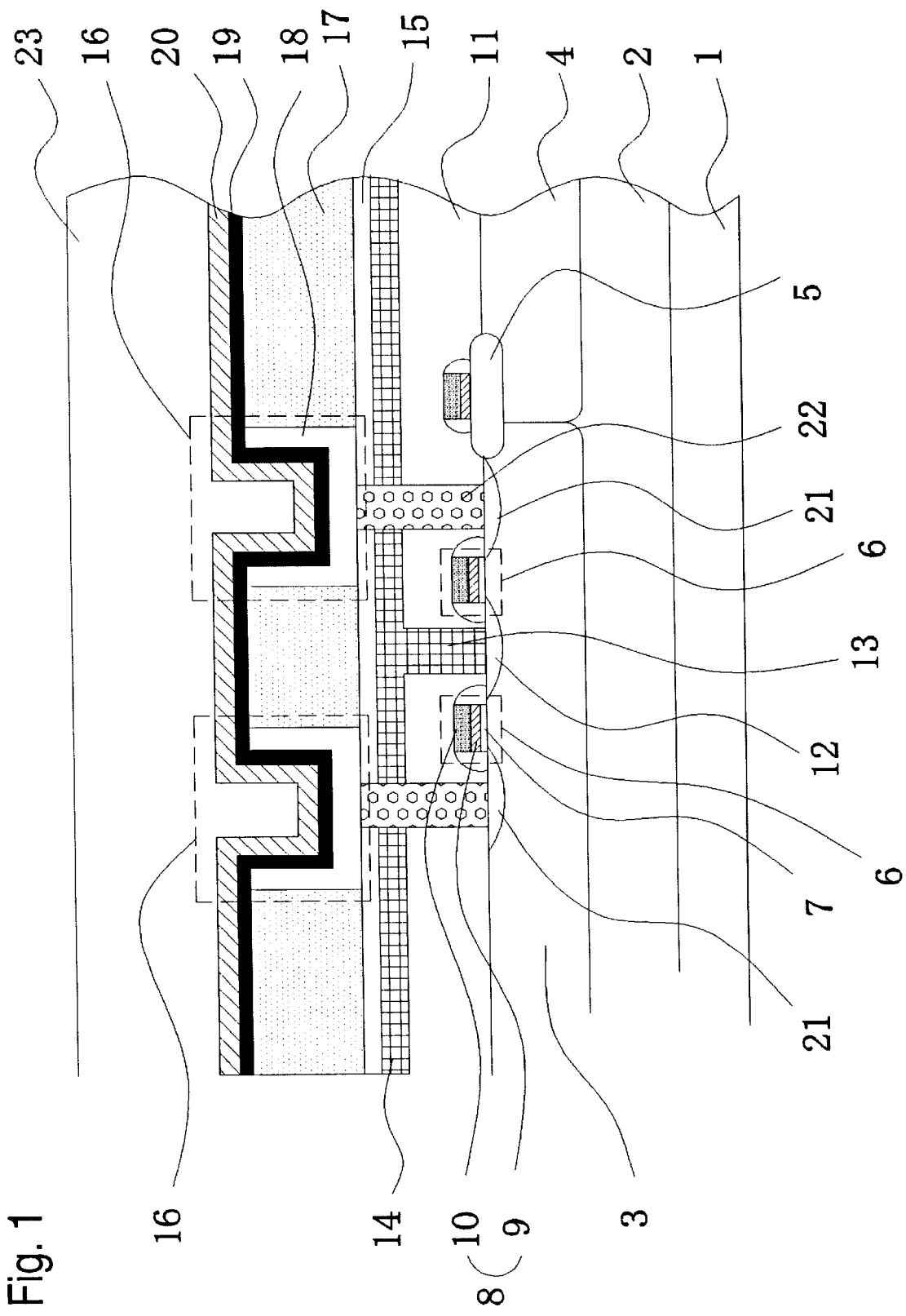

METHOD FOR FABRICATING A CAPACITOR HAVING A TANTALUM OXIDE DIELECTRICS IN A SEMICONDUCTOR DEVICE

BACKGROUND OF THE INVENTION

The present invention relates to a method for fabricating a semiconductor device, and more specifically to a method for fabricating a capacitor having a capacitor dielectric film formed of $Ta_2O_5$ (tantalum oxide) in a semiconductor device.

For microminiaturization of a semiconductor memory, it has become difficult to ensure a necessary capacitance only by increasing a surface area of a storage capacitor. Therefore, a method has been proposed which fabricates a semiconductor device having a capacitor having a capacitor dielectric film formed of $Ta_2O_5$ (tantalum oxide) which has a relative dielectric constant remarkably larger than that of SiN (silicon nitride) being used in the prior art. However, the $Ta_2O_5$ film has a problem that the $Ta_2O_5$ film is inferior to the SiN film in heat resistant property and a leak current is large.

In order to overcome this problem, IEEE Electron Device Letter, P514, 1989 proposes a semiconductor device fabricating method in which a $Ta_2O_5$ film is annealed in the presence of ultraviolet radiation and ozone ($O_3$). Furthermore, Journal of Electrochemical Society, P1246, 1994 proposes a semiconductor device fabricating method in which a $Ta_2O_5$ film is treated with an oxygen plasma.

However, these proposals have another problem as follows: In the semiconductor device fabricating method proposed by IEEE Electron Device Letter, P514, 1989, since ultraviolet is irradiated to the whole of the device, reliability of transistors is deteriorated. In the semiconductor device fabricating method proposed by Journal of Electrochemical Society, P1246, 1994, the $Ta_2O_5$ film is damaged by the ion irradiation, and since the film quality cannot be improved over the whole surface of the capacitor dielectric film since ions and radials are not sufficiently uniformly irradiated in a coarse surface electrode structure.

BRIEF SUMMARY OF THE INVENTION

Accordingly, it is an object of the present invention to provide a semiconductor device fabricating method which has overcome the above mentioned problems of the prior art.

Another object of the present invention is to provide a method for fabricating a capacitor having a capacitor dielectric film formed of $Ta_2O_5$ (tantalum oxide) in a semiconductor device, the method being capable of improving the film quality over the whole surface of the capacitor dielectric film to realize a capacitor having an excellent heat resistance property and a good leak current characteristics and at the same time capable of maintaining a good reliability of a transistor.

The above and other objects of the present invention are achieved in accordance with the present invention by a method for fabricating a capacitor having a capacitor dielectric film formed of $Ta_2O_5$ in a semiconductor device, the method comprising the step of:

forming a capacitor lower electrode on an insulating film formed on a semiconductor substrate;

forming a $Ta_2O_5$ film on the capacitor lower electrode;

immersing the semiconductor substrate into a $H_2O_2$ containing solution;

heat-treating the semiconductor substrate; and forming a capacitor upper electrode on the $Ta_2O_5$ film.

In the above mentioned capacitor fabricating method in accordance with the present invention, the oxygen vacancy density in the $Ta_2O_5$ film is decreased by treating the $Ta_2O_5$ film with the $H_2O_2$ containing solution, with the result that the leak current of the capacitor having the capacitor dielectric film formed of $Ta_2O_5$ is reduced.

Furthermore, the film quality of the $Ta_2O_5$ film is improved by heat-treating the $Ta_2O_5$ film, with the result that the leak current of the capacitor having the capacitor dielectric film formed of $Ta_2O_5$ is reduced.

On the other hand, no ultraviolet radiation is carried out in the process for fabricating the capacitor and hence the semiconductor device having the capacitor. Therefore, it is possible to maintain a good reliability of the transistor, because the reliability of the transistor is in no way deteriorated by the ultraviolet radiation.

Since both the treatment with the $H_2O_2$ containing solution and the heat treatment are an isotropic reaction, the $Ta_2O_5$ film can be uniformly improved over the whole surface of the $Ta_2O_5$ film even in a coarse surface electrode structure.

In one embodiment of the capacitor fabricating method in accordance with the present invention, the heat-treatment is conducted at a temperature not less than 700° C. Since crystallization of $Ta_2O_5$ occurs at the temperature not less than 700° C., the film quality of the $Ta_2O_5$ film is greatly improved. Accordingly, the effect of reducing the leak current of the capacitor can further be enhanced.

In a preferred embodiment of the capacitor fabricating method in accordance with the present invention, the heat-treatment is conducted in an oxidizing atmosphere. When the heat-treatment is conducted in the oxidizing atmosphere, oxygen is effectively absorbed in the $Ta_2O_5$ film. Accordingly, the effect of reducing the leak current of the capacitor can further be enhanced.

In a specific embodiment of the capacitor fabricating method in accordance with the present invention, the heat-treatment is conducted in an oxygen containing atmosphere. Since the heat-treatment was conducted in the oxygen containing atmosphere, oxygen is effectively absorbed in the $Ta_2O_5$ film. Accordingly, the effect of reducing the leak current of the capacitor can further be enhanced.

In a preferred embodiment of the capacitor fabricating method in accordance with the present invention, the $H_2O_2$ containing solution has the $H_2O_2$ concentration not less than 5%. If the $H_2O_2$ concentration of the $H_2O_2$ containing solution is not less than 5%, reactivity for compensating the oxygen vacancy in the $Ta_2O_5$ film is intensified. Accordingly, the effect of reducing the leak current of the capacitor can further be enhanced.

In a more preferable embodiment of the capacitor fabricating method in accordance with the present invention, the temperature of the $H_2O_2$ containing solution is no less than 60° C. If the temperature of the $H_2O_2$ containing solution is no less than 60° C., reactivity for compensating the oxygen vacancy in the $Ta_2O_5$ film is intensified. Accordingly, the effect of reducing the leak current of the capacitor can further be enhanced.

In addition, the time of immersing the semiconductor substrate into the $H_2O_2$ containing solution is preferred to be not shorter than one minute, although the required immersing time depends upon the temperature of the $H_2O_2$ containing solution and the $H_2O_2$ concentration of the $H_2O_2$ containing solution.

The above and other objects, features and advantages of the present invention will be apparent from the following description of preferred embodiments of the invention with reference to the accompanying drawings.

BRIEF DESCRIPTION OF THE DRAWINGS

FIG. 1 is a diagrammatic partial sectional view of a DRAM (dynamic random access memory) fabricated by utilizing one embodiment of the capacitor fabricating method in accordance with the present invention;

DETAILED DESCRIPTION OF THE INVENTION

Figure 2A:
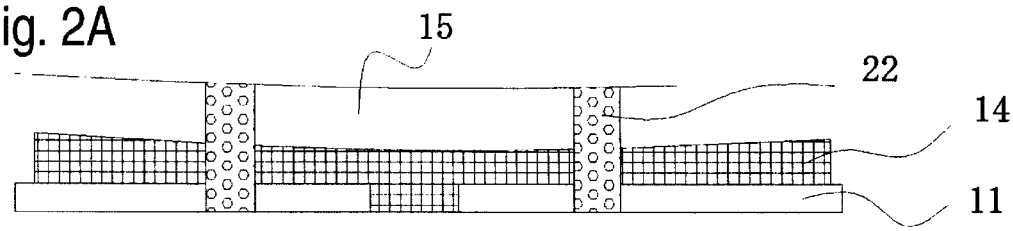
FIGS. 2A to 2E are diagrammatic partial enlarged sectional views of a DRAM capacitor portion for illustrating the process of the embodiment of the capacitor fabricating method in accordance with the present invention.

Referring to FIG. 1, there is shown a diagrammatic partial sectional view of a DRAM (dynamic random access memory) fabricated by utilizing one embodiment of the capacitor fabricating method in accordance with the present invention.

As shown in FIG. 1, a memory cell section of the DRAM comprises a p-type silicon substrate 1, an n-well 2 formed at a principal surface of the substrate 1, and a first p-well 3 formed on a surface of the n-well 2 and surrounded by an n-type isolation region 4. Although not shown, the n-well 2 is partially removed from the p-type silicon substrate 1, and a second p-well (not shown) is formed on an exposed surface of the p-type silicon substrate 1 from which the n-well 2 was removed. The first p-well 3 and the second p-well are isolated from each other by the n-type isolation region 4 and a field oxide film 5 formed on a surface of the n-type isolation region 4.

At a surface of the first p-well 3, a transistor 6 is formed in an active region confined and isolated by the field oxide film 6 to form a memory cell transistor. One pair of memory cells are shown in FIG. 1, and therefore, one pair of transistors 6 included in the pair of memory cells, respectively, are shown in FIG. 1. Each transistor 6 comprises a gate oxide film 7 formed at the surface of the first p-well 3 and a gate electrode 8 formed on the gate oxide film 7. The gate electrode 8 is formed of a multilayer film composed of a polysilicon film 9 formed on the gate oxide film 7 and a metal silicide 10 formed on the polysilicon film 9. A pair of source/drain regions 12 and 21 are formed in the first p-well 3 at opposite sides of each gate electrode 8, respectively, in such a manner that the source/drain region 12 between the two gate electrodes 8 is in common to the pair of transistors 6.

The transistors 6 are covered with a first interlayer insulating film 11 deposited on the whole surface of the substrate. A bit line contact 13 is formed to penetrate through the first interlayer insulating film 11 to reach the source/drain region 12 in common to the pair of transistors 6. On the first interlayer insulating film 11, a bit line 14 is formed to contact with the source/drain region 12 through the bit line contact 13.

The bit line 14 and the first interlayer insulating film 11 are covered with a second interlayer insulating film 15, and a stacked capacitor 16 is formed on the second interlayer insulating film 15. A third interlayer insulating film 17 is formed on the second interlayer insulating film 15 to surround each stacked capacitor 16.

The stacked capacitor 16 includes a lower electrode 18, a dielectric film 19 formed of a $Ta_2O_5$ film, and an upper electrode 20.

As shown in FIG. 1, a pair of capacitor contact holes 22 are formed to penetrate through the first and second interlayer insulating films 11 and 15 to reach the independent source/drain region 21 of the pair of transistors 6, respectively. Each lower electrode 18 is connected through the capacitor contact hole 22 to the source/drain region 21.

The $Ta_2O_5$ film 19 and the upper electrode 20 are continuously formed in common with the capacitors of all the memory cells, so that the $Ta_2O_5$ film 19 and the upper electrode 20 extend over a surface of the third interlayer insulating film 17. A contact (not shown) is formed on the upper electrode 20, so as to provide a connection point to be connected to an upper level interconnection. The capacitors 16 and the third interlayer insulating film 17 are covered with a fourth interlayer insulating film 23.

Now, a process for forming the capacitor 16 will be described with reference to FIGS. 2A to 2E, which are diagrammatic partial enlarged sectional views of a DRAM capacitor portion for illustrating the process of the embodiment of the capacitor fabricating method in accordance with the present invention.

As shown in FIG. 2A, the capacitor contact holes 22 are formed to penetrate through the first and second interlayer insulating films 11 and 15, and a phosphorus doped polysilicon film or a film of a metal such as W (tungsten) is deposited to fill up the contact holes 22 and to cover the second interlayer insulating film 15. Then, the deposited film is etched back so that a plug formed of the phosphorus doped polysilicon film or the metal film remains in the capacitor contact holes 22.

Figure 2B:
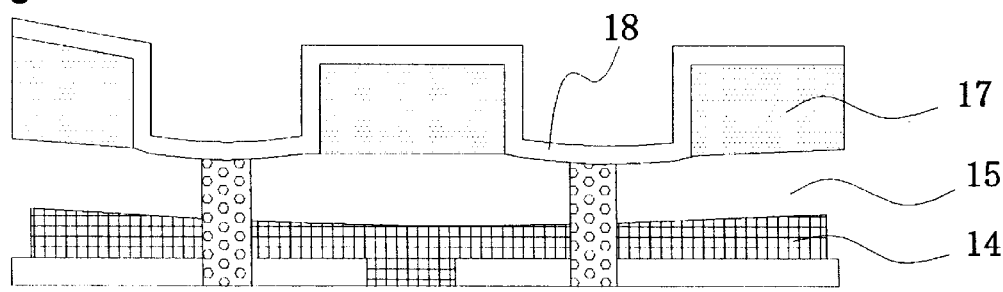
Figure 2C:
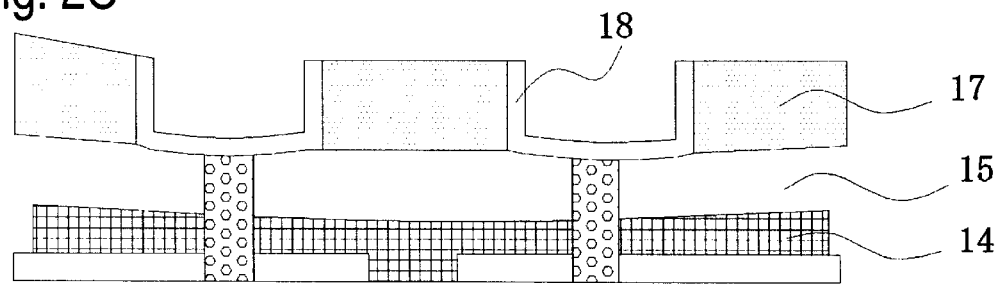

Then, as shown in FIG. 2B, the third interlayer insulating film 17 is deposited on the second interlayer insulating film 15, and a cylindrical capacitor formation hole used for forming the capacitor lower electrode 18 is formed in the third interlayer insulating film 17 to reach the plug in each capacitor contact hole 22. A phosphorus doped amorphous silicon film 18 is deposited to cover an inner surface of the cylindrical capacitor formation hole and an upper surface of the third interlayer insulating film 17, and an oxide film is deposited to fill up the cylindrical capacitor formation hole and to cover the phosphorus doped amorphous silicon film 18. Furthermore, the oxide film and the phosphorus doped amorphous silicon film 18 are etched back so that the phosphorus doped amorphous silicon film 18 remains only on the inner surface of the cylindrical capacitor formation hole, and then, the oxide film remaining in the cylindrical capacitor formation hole is removed. Thus, there is obtained the structure in which the lower electrode 18 is formed of the phosphorus doped amorphous silicon film covering only the inner surface of the cylindrical capacitor formation hole, as shown in FIG. 2C.

Thereafter, the third interlayer insulating film 17 can be removed by a wet etching so that a portion or all of an outer surface of the cylindrical capacitor lower electrode 18 is exposed in order to increase the capacitor surface area, as known to persons skilled in the art.

Figure 2D:
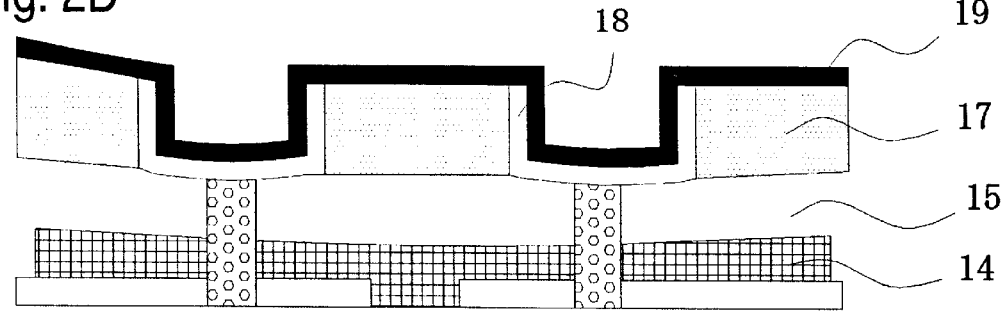

Then, as shown in FIG. 2D, the $Ta_2O_5$ film 19 is grown on the whole surface by means of a LPCVD (low pressure chemical vapor deposition) process using $Ta(OC_2H_5)_5$ and $O_2$ as a starting material. Thereafter, the substrate thus obtained is immersed into a $H_2O_2$ (hydrogen peroxide) containing solution. By treating the substrate with the $H_2O_2$ containing solution, an oxygen vacancy density in the $Ta_2O_5$ film 19 is improved. Immediately after the substrate is treated with the $H_2O_2$ containing solution, a heat treatment is carried to oxidize and crystallize the $Ta_2O_5$ film 19.

Figure 2E:
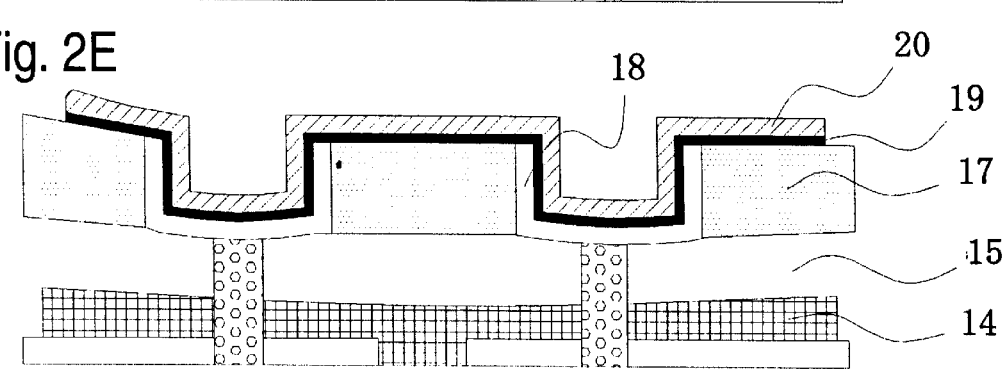

Thereafter, as shown in FIG. 2E, a TiN film is deposited to form the capacitor upper electrode 20 on the $Ta_2O_5$ film 19 by use of a CVD (chemical vapor deposition) process using $TiCl_4$ and $NH_3$ as a starting material.

In the above mentioned embodiment of the present invention, the step of immersing the substrate in the $H_2O_2$ containing solution is preferred to fulfill the following condition: The temperature of the $H_2O_2$ containing solution is preferred to be not less than 60° C., by reason of a reactivity between oxygen supplied from $H_2O_2$ and oxygen vacancy sites in the $Ta_2O_5$ film. The concentration of $H_2O_2$ in the $H_2O_2$ containing solution is preferred to be not less than 5% by reason of the above mentioned reactivity. The $H_2O_2$ containing solution is not limited to only a pure water that contains $H_2O_2$ but may be a mixed solution such as a solution of hydrochloric acid: $H_2O_2:H_2O=1:5:20$.

Furthermore, the heat treatment conducted after the treatment with the $H_2O_2$ containing solution is preferred to fulfill the following condition: The heat treatment is preferred to be not less than 700° C., for the purpose of improving the film quality by crystallizing the $Ta_2O_5$ film. The atmosphere for the heat treatment is preferred to be an oxidizing atmosphere in order to cause the oxygen to be absorbed in the $Ta_2O_5$ film. An atmosphere containing an oxygen gas is more preferable.

Figure 3:
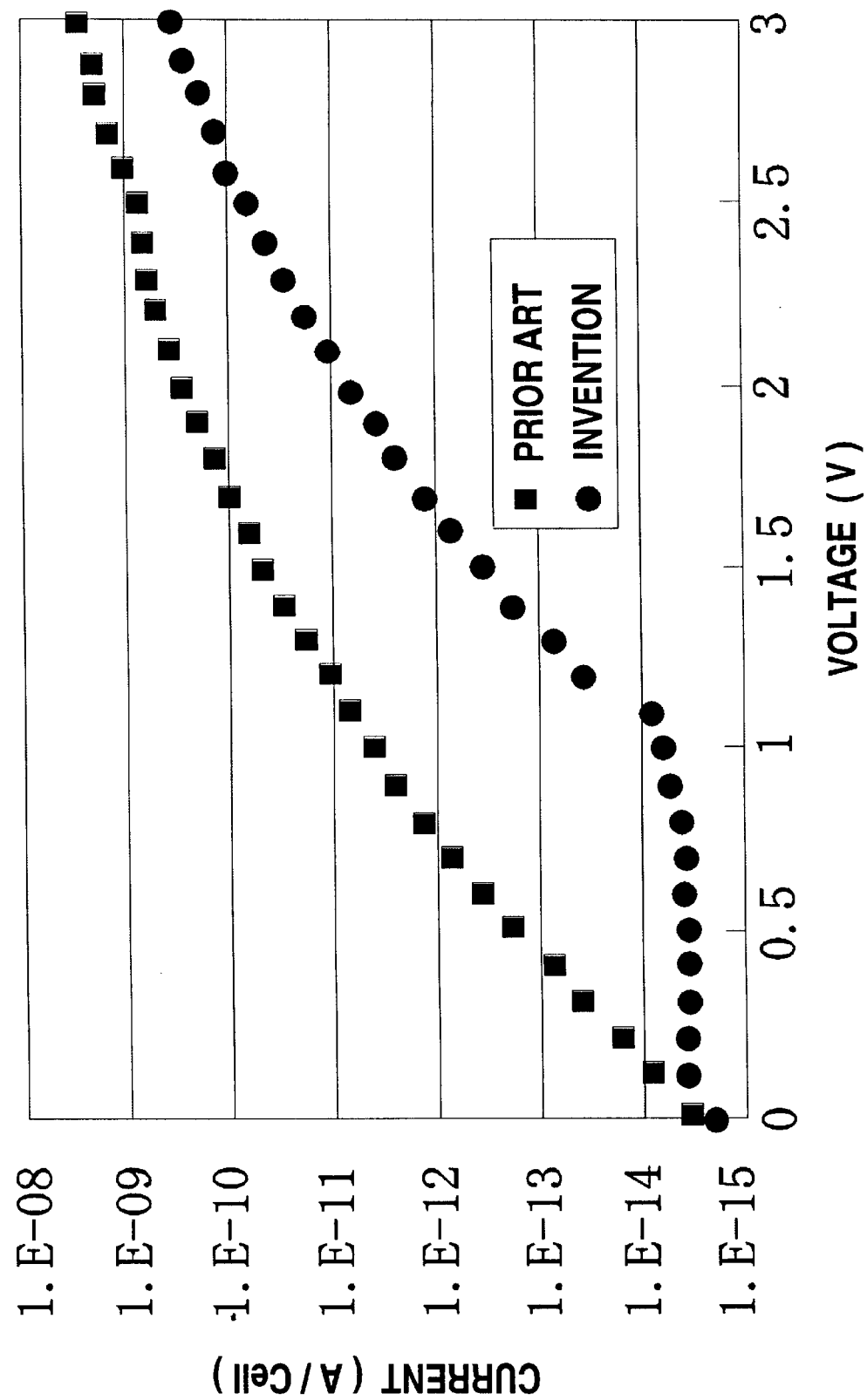
FIG. 3 is a graph showing a current-to-voltage characteristics of a stacked capacitor formed in accordance with the embodiment of the capacitor fabricating method of the present invention and a current-to voltage characteristics of a stacked capacitor formed in accordance with the prior art method.

Referring to FIG. 3, there is shown a graph showing a current-to-voltage characteristics of a stacked capacitor formed in accordance with the embodiment of the capacitor fabricating method of the present invention and a current-to-voltage characteristics of a stacked capacitor formed in accordance with the prior art method.

The stacked capacitor formed in accordance with the capacitor fabricating method of the present invention was formed by immersing the substrate in the $H_2O_2$ containing pure water solution under the condition that the temperature of the solution is 65° C., the concentration of $H_2O_2$ is 5%, and the immersing time is 10 minutes, and by heat-treating the substrate (that was treated with the $H_2O_2$ containing solution) in an oxygen gas atmosphere at a temperature of 800° C.

The measurement was conducted as follows: Ten thousand stacked capacitors are formed in parallel, and the total current value of the 10000 stacked capacitors connected in parallel was measured and divided by 10000 so that the current value per one capacitor was obtained. In the stacked capacitor formed in accordance with the prior art method, the leak current value when the voltage of 1V is applied across the capacitor was 5E-12 amperes. On the other hand, in the stacked capacitor formed in accordance with the embodiment of the semiconductor device fabricating method of the present invention, the leak current value when the voltage of 1V is applied across the capacitor was reduced to 5E-15 amperes.

As mentioned above, the capacitor fabricating method in accordance with the present invention has the following advantages:

By treating the $Ta_2O_5$ film with the $H_2O_2$ containing solution, the oxygen vacancy density in the $Ta_2O_5$ film is decreased, with the result that the leak current of the capacitor having the capacitor dielectric film formed of $Ta_2O_5$ is reduced.

In addition, by heat-treating the $Ta_2O_5$ film, the film quality of the $Ta_2O_5$ film is improved, with the result that the leak current of the capacitor having the capacitor dielectric film formed of $Ta_2O_5$ is reduced.

On the other hand, no ultraviolet radiation is carried out in the process for fabricating the capacitor and hence the semiconductor device having the capacitor. Therefore, it is possible to maintain a good reliability of the transistor, because the reliability of the transistor is in no way deteriorated by the ultraviolet radiation.

Since both the treatment with the $H_2O_2$ containing solution and the heat treatment are an isotropic reaction, the $Ta_2O_5$ film can be uniformly improved over the whole surface of the $Ta_2O_5$ film even in a coarse surface electrode structure.

The invention has thus been shown and described with reference to the specific embodiments. However, it should be noted that the present invention is in no way limited to the details of the illustrated structures but changes and modifications may be made within the scope of the appended claims.

What is claimed is:

1. A method of fabricating a capacitor having a capacitor dielectric film formed of $Ta_2O_5$ in a semiconductor device, the method comprising:

forming a capacitor lower electrode on an insulating film formed on a semiconductor substrate;

forming a $Ta_2O_5$ film on said capacitor lower electrode;

immersing said semiconductor substrate in a $H_2O_2$ containing solution;

heat-treating of said semiconductor substrate at a temperature sufficient to oxidize and crystallize said $Ta_2O_5$ film, immediately after immersing said semiconductor substrate in a $H_2O_2$ containing solution for a predetermined time; and forming a capacitor upper electrode on said $Ta_2O_5$ film.

2. A method claimed in claim 1 wherein said heat-treating is conducted at a temperature not less than 700° C.

3. A method claimed in claim 1 wherein said heat-treating is conducted in at least one of an oxidizing atmosphere and an oxygen containing atmosphere.

4. A method claimed in claim 1 wherein said $H_2O_2$ containing solution has the $H_2O_2$ concentration not less than 5%.

5. A method claimed in claim 1 wherein the temperature of said $H_2O_2$ containing solution is not less than 60° C.

6. A method claimed in claim 1 wherein said heat-treatment is conducted in at least one of an oxidizing atmosphere at a temperature not less than 700° C. and an oxygen containing atmosphere at a temperature not less than 700° C.

7. A method claimed in claim 1 wherein said $H_2O_2$ containing solution has a $H_2O_2$ concentration not less than 5% and a temperature of said $H_2O_2$ containing solution is no less than 60° C.

8. A method claimed in claim 1 wherein said heat-treating is conducted in at least one of an oxidizing atmosphere at a temperature not less than 700° C. and an oxygen containing atmosphere at a temperature not less than 700° C., and said $H_2O_2$ containing solution has a $H_2O_2$ concentration not less than 5% and a temperature of said $H_2O_2$ containing solution is no less than 60° C.

* * * * *